(12) United States Patent
Wen

(10) Patent No.: US 7,255,114 B2
(45) Date of Patent: Aug. 14, 2007

(54) ION SAMPLING SYSTEM FOR WAFER

(75) Inventor: Rui-Hui Wen, Hsinchu (TW)

(73) Assignee: Powerchip Semiconductor Corp., Hsinchu (TW)

( * ) Notice: Subject to any disclaimer, the term of this patent is extended or adjusted under 35 U.S.C. 154(b) by 577 days.

(21) Appl. No.: 10/604,793

(22) Filed: Aug. 18, 2003

(65) Prior Publication Data

US 2004/0191140 A1  Sep. 30, 2004

(30) Foreign Application Priority Data

Mar. 31, 2003 (TW) .............................. 92107254 A

(51) Int. Cl.
*B08B 3/00* (2006.01)
(52) U.S. Cl. ................. 134/94.1; 134/95.3; 134/103.2; 134/105; 134/137; 134/155; 134/198; 134/902; 156/345.23; 156/345.24; 422/261
(58) Field of Classification Search ............... 134/94.1, 134/95.3, 105, 137, 144, 902, 103.2, 198; 438/905; 422/261; 156/345.23, 345.24
See application file for complete search history.

(56) References Cited

U.S. PATENT DOCUMENTS

| | | | | |
|---|---|---|---|---|
| 3,489,608 | A | * | 1/1970 | Jacobs et al. ............... 134/25.4 |
| 5,601,645 | A | * | 2/1997 | Nonomura et al. ........... 118/52 |
| 5,634,980 | A | * | 6/1997 | Tomita et al. .................. 134/3 |
| 6,309,981 | B1 | * | 10/2001 | Mayer et al. ................ 438/754 |
| 6,945,259 | B2 | * | 9/2005 | Masui et al. ............... 134/56 R |

FOREIGN PATENT DOCUMENTS

| | | | |
|---|---|---|---|
| JP | 3-23623 | * | 1/1991 |
| JP | 2000-005710 | | 1/2000 |

* cited by examiner

*Primary Examiner*—M. Kornakov
(74) *Attorney, Agent, or Firm*—Jianq Chyun IP Office

(57) ABSTRACT

An ion sampling method for wafer provides a wafer in a sampling chamber, wherein the wafer surface that is going to be sampled faces upward; spraying an extraction liquid continuously on the wafer surface to form a liquid film thereon; keeping the thickness of the film constant for dissolving the ion contaminants in the extraction liquid; and collecting the extract solution at the bottom of the sampling chamber.

10 Claims, 2 Drawing Sheets

ION SAMPLING SYSTEM FOR WAFER

CROSS REFERENCE TO RELATED APPLICATIONS

This application claims the priority benefit of Taiwan application serial no. 92107254, filed Mar. 31, 2003.

BACKGROUND OF INVENTION

1. Field of Invention

The present invention relates to a semiconductor process. More particularly, the present invention relates to an ion sampling system for wafer and a sampling method thereof.

2. Description of Related Art

In a fabrication process for a semiconductor wafer, contamination of the wafer surface is a serious problem. In general, contaminants that adhere on the wafer surface include organic compounds, metal impurities and ion contaminants, wherein these contaminants adversely affect the subsequent process of the products. For example, these contaminants may induce leakage current at the p-n junction of the device, reduce the life time of some carriers, lower the breakdown voltage of the gate oxide layer, cause erosion to the metal line, and other related problems. The lowering of the quality and the reliability of the semiconductor device is thus resulted. Further, the semiconductor device may even become ineffective. Therefore, during the fabrication of a semiconductor device, it is important to detect the amount of contaminants on the wafer surface.

During the detection process for contaminants on a wafer surface, the sampling procedure for contaminants on the wafer surface is the most important step. As an example, organic compound contaminants are sampled with a SWA (Silicon Wafer Analyzer) sampling instrument, followed by using a gas chromatography mass spectrometer (GC-MS) to detect the amount of the organic compound contaminants. The metal impurity contaminants are sampled with a WSPS (Wafer Surface Preparation System) instrument, followed by analyzing with an inductively coupled plasma mass spectrometer to determine the amount of the metal contaminants. The amount of the ion contaminants is determined by submerging the wafer in a two liter pure water for a period of time to transfer the ions from the wafer surface in the water. Ion chromatography is then used to concentrate and analyze the amount of the ion contaminants.

In accordance to the above wafer contaminant detection method, instrumentation is used to sample organic compounds and metal impurities. Further, the sampling of the organic compounds and the metal impurities is only directed to a single surface of the wafer because the fabrication of a semiconductor device is mostly conducted on one surface of the wafer, and only the presence of contaminants on that particular surface is relevant. Therefore, the detection accuracy for contaminants of organic compounds and metal impurities is higher. Since the sampling of ion contaminants is accomplished by submerging the wafer in two liters of pure water, ions on both sides of the wafer are being transferred in the water. The detection accuracy of ion contaminants is thereby questionable.

Further, since a large quantity of water is used to remove the ions from the wafer surface, the ion concentration in the water is very low. Therefore, more time is required for and is being wasted on concentrating the ion solutions. Further, the above procedure is conducted in an open environment, not only the wafer gets contaminated during the period of fabrication, it can be further contaminated during the sampling procedure. The contaminants in the environment could contaminate the pure water during the sampling procedure to affect the accuracy of the detection result for the ion contaminants.

SUMMARY OF INVENTION

Accordingly, the present invention provides an ion sampling system for a wafer surface and a sampling method thereof, wherein only a single surface of the wafer is sampled for ion contaminants.

The present invention also provides an ion sampling system for a wafer surface and a sampling method thereof, wherein a contaminating source from the atmosphere is reduced to accurately detect the amount of ion contaminants on the wafer surface.

The present invention further provides an ion sampling system for a wafer surface and a sampling method thereof, wherein the sample volume can be lowered to increase the concentration of the sample. The time required for concentrating the sample and the total time required for analysis are thus effectively reduced.

The present invention further provides an ion sampling system for a wafer surface, wherein the ion sampling system includes at least the following components. The sampling chamber includes an upper and a lower part, wherein the upper part is for holding a wafer, and the lower part is funnel shape and includes a collection opening for the extract solution. An wafer carrier apparatus is disposed in the sampling chamber. An extraction liquid spraying apparatus is disposed at the top part of the sampling chamber. An extraction liquid supply apparatus is connected to the extraction liquid spraying apparatus to provide an extraction liquid to the extraction liquid spraying apparatus. A cleaning/drying apparatus which includes a cleaning/drying nozzle, a cleaning solution supply apparatus and a liquid supply apparatus is used for cleaning/drying the sampling chamber.

The wafer carrier apparatus includes a plurality wafer carrier beams, disposed on and dispersedly arranged around the upper sidewall of the sampling chamber. The peripheral surface of the wafer carrier beam is configured with a first wafer anchoring pin that extends in a first direction. One end of the wafer carrier beam extends through the upper sidwall of the sampling chamber, wherein a rotating bar is disposed on the one end of the wafer carrier beam for rotating the wafer carrier beam. The peripheral surface wafer carrier beam is also configured with a second wafer anchoring pin that extends in a second direction, wherein the second direction is different from the first direction. There are at least three of the above wafer carrier beams, and at least one of the wafer carrier beam is at a height lower than those of the other carrier beams. The above extraction liquid spraying apparatus includes a plurality of spray nozzles or nebulizers that are evenly disposed at the top part of the sampling chamber. The extraction liquid supply apparatus includes a temperature adjustment device to adjust the temperature of the extraction liquid.

The sampling system of the present invention is disposed with a rotatable wafer carrier beam for replacing the wafer anchoring pin. The sampling system is therefore applicable for wafer of different dimensions. Further, the amount of the extraction liquid used in the ion contaminant sampling system for a wafer surface of the present invention is less than the amount used in the prior art. The amount of the extraction liquid used and the time required for concentrating the extract solution are reduced to further scale down the manufacturing cost. Further, the temperature of the extraction liquid can be adjusted to increase the dissolution rate of ions.

In accordance to the present invention, a wafer surface sampling system is provided, wherein the sampling system includes at least the following components. A sampling chamber that includes an upper part and a lower part, wherein the upper part is for accommodating the wafer, and the lower part is funnel shape and includes an extract solution collection opening. A wafer carrier apparatus is disposed in the sampling chamber. The wafer carrier apparatus driving system is connected to the wafer carrier apparatus, wherein the wafer carrier apparatus driving system drives the wafer carrier apparatus to rotate. An extraction liquid spraying apparatus is disposed at the top part of the sampling chamber. A moving apparatus holds and moves the extraction liquid spraying apparatus. An extraction liquid supply apparatus is connected to the extraction liquid spraying apparatus.

The above wafer surface ion sampling system further includes a cleaning/drying apparatus. A cleaning/drying spray nozzle is disposed in the sampling chamber for spraying a cleaning solution or a fluid to the sampling chamber. A cleaning solution supply apparatus connects to the cleaning/drying spray nozzle to supply a cleaning solution to the cleaning/drying spray nozzle. A fluid supply apparatus connects to the cleaning/drying spray nozzle to supply a fluid to the cleaning/drying nozzle.

The above wafer carrier apparatus further includes a carrier platform, a rotating shaft that coaxially connects with the carrier platform, and a carrier adjustment unit between the carrier platform and the rotating shaft. The extraction liquid spraying apparatus is a spray nozzle or a nebulizer. The extraction liquid supply apparatus, a cleaning solution supply apparatus, and a fluid supply apparatus can all be installed with a temperature adjustment device to adjust the temperature of the extraction liquid, the cleaning solution or the fluid.

The present invention employs the wafer carrier apparatus driving system for driving the wafer carrier to rotate, and the extraction liquid spraying apparatus for spraying an extraction liquid to the wafer surface where ion contaminants are going to be removed. The ion contaminants on the wafer surface are dissolved in the extraction liquid. The amount of ion contaminants on the wafer surface can be accurately determined. Further, by controlling the rotating speed of the wafer carrier machine, the fluid film on the wafer surface is controlled to have a certain thickness to effectively dissolve the ion contaminants that are on the wafer surface. Further, the amount of the extraction liquid used in the ion contaminant sampling system for a wafer surface of the present invention is less the amount used in the prior art. The amount of extraction liquid used and the time require for concentrating the extract solution are reduced to further scale down the manufacturing cost. Further, the temperature of the extraction liquid can be adjusted to enhance the dissolution rate of ions.

Further, in accordance to the ion sampling system for a wafer surface of the present invention, the sampling chamber is disposed with a cleaning/drying spray nozzle, which is used to spray a cleaning solution to clean the sampling chamber. The cleaning/drying spray nozzle further sprays a fluid (nitrogen gas/helium gas/argon gas/pressurized dry air, etc.) to dry the sampling chamber at a desired temperature. After the cleaning and the drying of the sampling chamber, another cleaning step can perform to collect the cleaning solution to ensure the sampling chamber is adequately cleaned.

The present invention provides a wafer surface ion sampling method, wherein a wafer is provided, and the wafer is placed inside the sampling chamber. Extraction liquid is continuously being sprayed to form a liquid film on the wafer surface and to maintain the liquid film to a certain thickness to dissolve the ion contaminants on the wafer surface in the extraction liquid. The extract solution is then collected at the bottom of the collection chamber.

In accordance to the above sampling method, continuously spraying the extraction liquid to form a liquid film on the wafer surface and maintaining the liquid film to a certain thickness to dissolve the ion contaminants on the wafer surface in the extraction liquid further includes tilting the wafer at an angle for the extract solution to flow to the bottom sampling chamber.

In accordance to the above sampling method, continuously spraying an extraction liquid to form a liquid film on the wafer surface and maintaining the liquid film to a certain thickness to dissolve the ion contaminants on the wafer surface in the extraction liquid further includes rotating the wafer for a portion of the extract solution to flow to the bottom of the sampling chamber. Moreover, the thickness of the liquid film is controlled by controlling the rotating speed of the wafer.

During the sampling procedure of ion contaminants, extraction liquid is sprayed to the wafer surface where ion contaminants are going to be removed. Further by tilting the wafer at an angle or by rotating the wafer, ions on the wafer are dissolved in the extraction liquid. The amount of ion contaminants on the wafer surface can also be accurately determined. The amount of extraction liquid used and the time require for concentrating the extract solution are reduced to further scale down the manufacturing cost.

The present invention provides a wafer surface ion sampling method, wherein a wafer is provided, and the wafer is placed inside the sampling chamber. After continuously spraying the extraction liquid on the wafer surface that is going to be sampled, a liquid film is formed thereon and the liquid film maintains a certain thickness for dissolving the ion contaminants in the extraction liquid. Further the wafer is tilted at an angle for a portion of the extract solution to flow to the bottom of the sampling chamber. Further, the extraction liquid is continuously being sprayed on the wafer surface to form the liquid film and to maintain the liquid film at a certain thickness for dissolving the ion contaminants on the surface of the wafer in the extraction liquid. The wafer is also rotated to allow a portion of the extract solution to flow to and be collected at the bottom of the sampling chamber.

In the above method, the thickness of the thin film is controlled by controlling the rotating speed of the wafer. Further, the wafer-tilting sampling step and the wafer-rotating sampling step can be repeated for several times.

During the ion contaminant sampling procedure, both the stationary-tilt sampling method and the dynamic-rotational sampling method can be used. Therefore, the liquid film on the wafer remains rolling and moving, which enhances the transfer of the ions from the wafer to the extraction liquid.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

First Exemplary Embodiment

Figure 1:
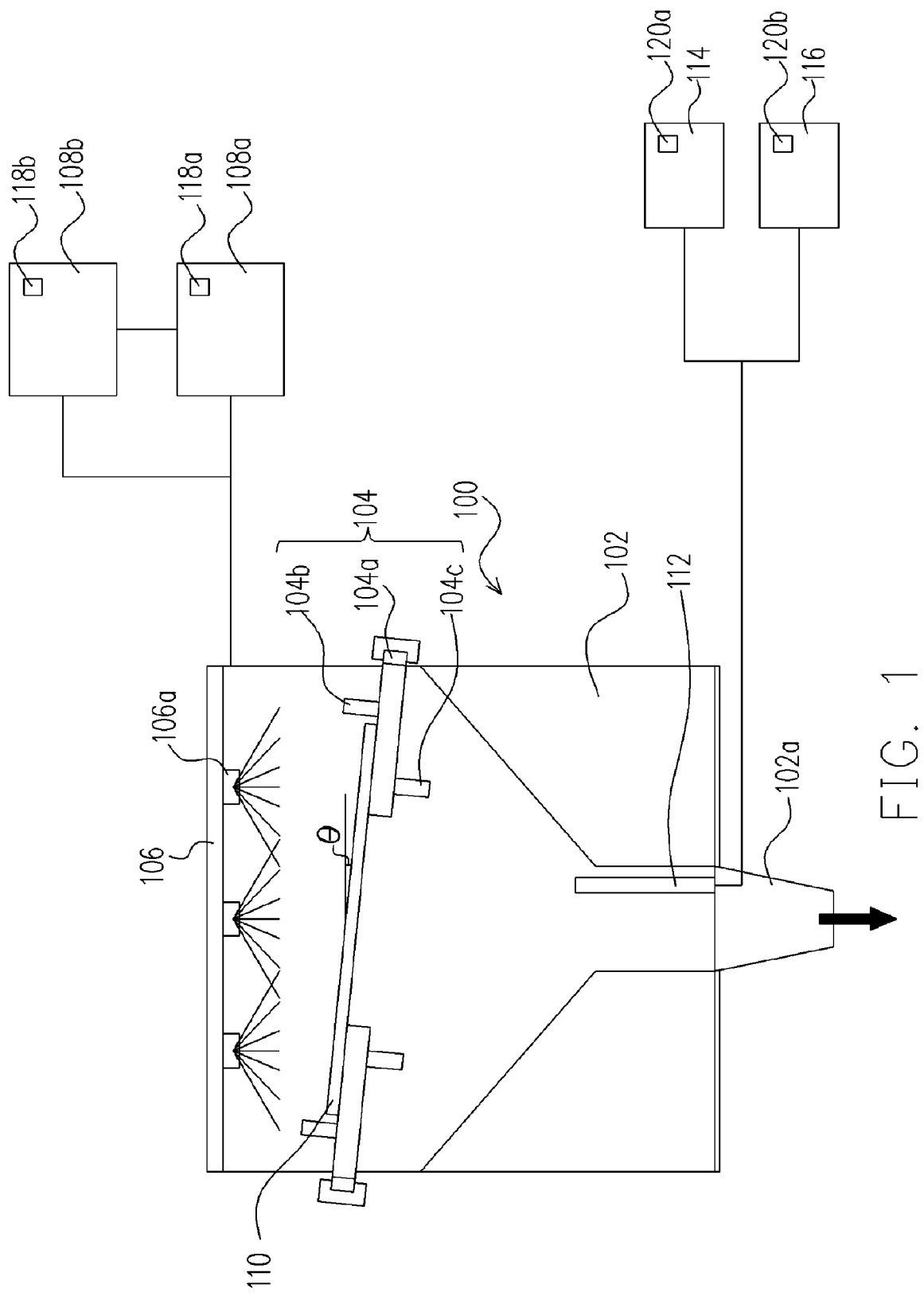
FIG. 1 is a schematic diagram illustrating an ion sampling system for a wafer surface according to a first exemplary embodiment of the present invention.

FIG. 1 is a schematic diagram illustrating an ion sampling system for a wafer surface according to the first exemplary embodiment of the present invention.

Referring to FIG. 1, an ion sampling system 100 for a wafer surface according to the first exemplary embodiment of the present invention includes at least a sampling chamber 102, a wafer carrier beam 104, an extraction liquid spraying apparatus 106, an extraction liquid supply apparatus 108a, a fluid supply apparatus 108b, a cleaning/drying spray nozzle 112, a cleaning solution supply apparatus 114, and a fluid supply apparatus 116. The cleaning/drying spray nozzle 112, the cleaning solution supply apparatus 114 and fluid supply apparatus 116 together constitute a cleaning/drying apparatus.

The sampling chamber 102 can be separated into, for example, an upper part and a lower part. The upper part of the sampling chamber 102 is designed to accommodate a semiconductor wafer 110 (which includes an 8 inch wafer, a 12 inch wafer or wafers of other dimensions). The lower part of the sampling chamber 102, for example, is designed to have a funnel shape, wherein the lower part of the sampling chamber 102 includes an extract solution collection opening 102a.

The plurality of wafer carrier beams 104, for example, is disposed on and dispersedly arranged around the upper part of the sampling chamber 102. Each of the wafer carrier beams 104 is, for example, bar-shaped, wherein one end of the wafer carrier beam 104 is extended to the outside of the sampling chamber 102, allowing the wafer carrier beam 104 to rotate freely. A rotating handle 104a is disposed on the extended end of the wafer carrier beam 104. A wafer anchoring pin 104b, which extends in one direction, is disposed on a peripheral surface of the wafer carrier beam 104. Another wafer anchoring pin 104c, which is extended in a different direction, forms at least a 90 degrees angle with the wafer anchoring pin 104b. The wafer carrier beam 104, therefore, can at most include four sets of wafer anchoring pins. The wafer anchoring pin 104b, for example, is used to firmly hold a wafer of a larger dimension (for example, a 12 inch wafer), whereas the wafer anchoring pin 104c, for example, is used to firmly hold a wafer of a smaller dimension (for example, an 8 inch wafer). In this exemplary embodiment, there are at least three wafer carrier beams. Further, the height of one wafer carrier beam 104 is lower than the heights of other wafer carrier beams 104. As a result, the wafer 110 can be tilted at an angle θ when the wafer 110 is placed on the wafer carrier beams 104.

The extraction liquid spraying apparatus 106, for example, is disposed at the top part of the sampling chamber 102. The extraction liquid spraying apparatus 106, for example, is included with a plurality of spray nozzles 106a (or a nebulizer). The extraction liquid spraying apparatus can evenly spray the extraction liquid on the wafer 110 surface, to cover the entire wafer surface with the extraction liquid.

The extraction liquid supply apparatus 108a, for example, is connected to the extraction liquid spraying apparatus 106 to supply an extraction liquid to the extraction liquid spraying apparatus 106. The extraction liquid supply apparatus 108a includes a temperature adjustment device 118a, which is used to adjust the temperature of the extraction liquid. The fluid supply apparatus 108b is connected to the extraction liquid spraying apparatus 106 and to the extraction liquid supply apparatus 108 to supply a fluid (includes nitrogen gas/helium gas/argon gas/pressurized dry air, etc.) to the extraction liquid supply device 108a to pressurize the extraction liquid. The fluid supply apparatus 108b includes a temperature adjustment device 118b to adjust the temperature of the fluid.

The cleaning/drying spray nozzle 112, for example, is disposed inside the sampling chamber 102 for spraying a cleaning solution (or nitrogen gas/helium gas/argon gas/pressurized dry air, etc.) to the sampling chamber 102 to clean the sampling chamber 102.

The cleaning solution supply apparatus 114, for example, is connected to the cleaning/drying spray nozzle 112 to provide the cleaning solution to the cleaning/drying spray nozzle 112. The cleaning solution includes, for example, deionized water, deionized water/hydrogen peroxide, etc. The cleaning solution supply apparatus 114 includes a temperature adjustment device 120a to adjust the temperature of the cleaning solution.

The fluid supply apparatus 116, for example, is connected to the cleaning/drying spray nozzle 112 to supply a fluid (including nitrogen gas/helium gas/argon gas/pressurized dry air, etc.) to the cleaning/drying spray nozzle 112 to dry the sampling chamber 102. The fluid supply apparatus 116 includes a temperature adjustment device 120b to adjust the fluid temperature.

In this first exemplary embodiment, the extraction liquid spraying apparatus 106 is connected to the extraction liquid supply apparatus 108a and the fluid supply apparatus 108b. The fluid supply apparatus 108b is, for example, a nitrogen gas/helium gas/argon gas supply apparatus, a pressurized air supply device and a cleaning solution supply device, etc., wherein the cleaning solution is, for example, deionized water, deionized water/hydrogen peroxide, etc. With the fluid supply device, a cleaning process and a drying process can be conducted on the sampling chamber 102 before and after sampling procedure.

The method to sample ions from a wafer surface with the wafer sampling system of the first exemplary embodiment of the present invention is disclosed as follow. This wafer surface ion sampling method is a stationary-tilt sampling method.

Referring to FIG. 1, a wafer 110 is provided, wherein this wafer 110 is, for example, a 12 inch wafer. Thereafter, the rotating handle 104a of the rotating wafer carrier beam 104 is rotated in such a way that the wafer anchoring pin 104b is tilted upward. The wafer 110 is then placed on the wafer carrier beam 104, wherein the sampling surface of the wafer 110 is faced upward. Thereafter, the extraction liquid supply apparatus 108a supplies an extraction liquid (for example, deionized water, etc.) to the extraction liquid spraying apparatus 106, wherein the temperature of the extraction liquid is controlled by the temperature adjustment device. Using the extraction liquid spraying apparatus 106, the extraction liquid is sprayed on the surface of the wafer 110 to form a liquid film on the surface of the wafer 110. The ions on the surface of the wafer 110 are then dissolved in the extraction liquid. As the extraction liquid on the wafer 110 surface accumulates to a certain level, a portion of the extract solution starts to flow along the tilted surface of the wafer 110 to the lower part of the sampling chamber 102, and is discharged from the extract solution collection opening 102a into a collection bottle (not shown). By continuously spraying the extraction liquid to the wafer surface and by controlling the spraying rate of the extraction liquid and the spraying intervals, the liquid film on the surface of the wafer 100 can maintain a certain thickness. The removal rate of the ion contaminants from the wafer 110 surface is thus effectively increased.

The extract solution collected at the extract solution collection opening 102a is analyzed using ion chromatograph to determine the amount of ions. The extract solution collected at the extract solution collection opening 102 can also be concentrated first before analyzing for the amount of ions using ion chromatograph.

After the wafer 110 is removed from the wafer carrier beam 104, the cleaning solution supply apparatus 114 provides a cleaning solution to the cleaning/drying spray nozzle 112 to clean the sampling chamber 102. After fully cleaning the sampling chamber 102, the supply of the cleaning solution is terminated and a fluid (nitrogen gas/helium gas/argon gas/pressurized dry air) is provided through the fluid supply apparatus 116 to dry the sampling chamber. After drying the sampling chamber 102, the supply of fluid (nitrogen gas/helium gas/argon gas/pressurized dry air) is discontinued. The cleaning of the sampling chamber 102 can also be accomplished using the extraction liquid spraying apparatus 106.

In accordance to the present invention, the sampling of the ion contaminants is conducted by spraying an extraction liquid on a wafer surface where ion contaminants are going to be removed. Therefore, only the ions on the wafer surface that needs to be detected are dissolved in the extraction liquid. As a result, the amount of ion contaminants on the surface of the wafer can be accurately detected. Further, the ion sampling system for a wafer surface of the present invention is installed with a wafer carrier beam 104, wherein the wafer anchoring pin can be replaced by rotating the wafer carrier beam 104. The ion sampling system for a wafer surface of the present invention is thus applicable for wafers of different sizes. Further, the ion sampling system for wafer surface of the present invention can control the collection of the extract solution by controlling the tilt angle of the wafer. In accordance to the ion contaminant sampling system for wafer surface of the present invention and the sampling method, the amount extraction liquid used and the time required for concentrating the extract solution are reduced to further scale down the cost.

Further, the ion contaminant sampling system for a wafer surface of the present invention can be installed in a clean mini environment, for example, inside a hood that is installed with a fan, a chemical filtering device and an ultra low penetration air filter (ULPA). Since the ultra-micro particles can be filtered by an ULPA filter inside the hood, while the chemical filtering device provides the function of removing acid or basic compounds, the hood can be maintained clean.

Figure 2:
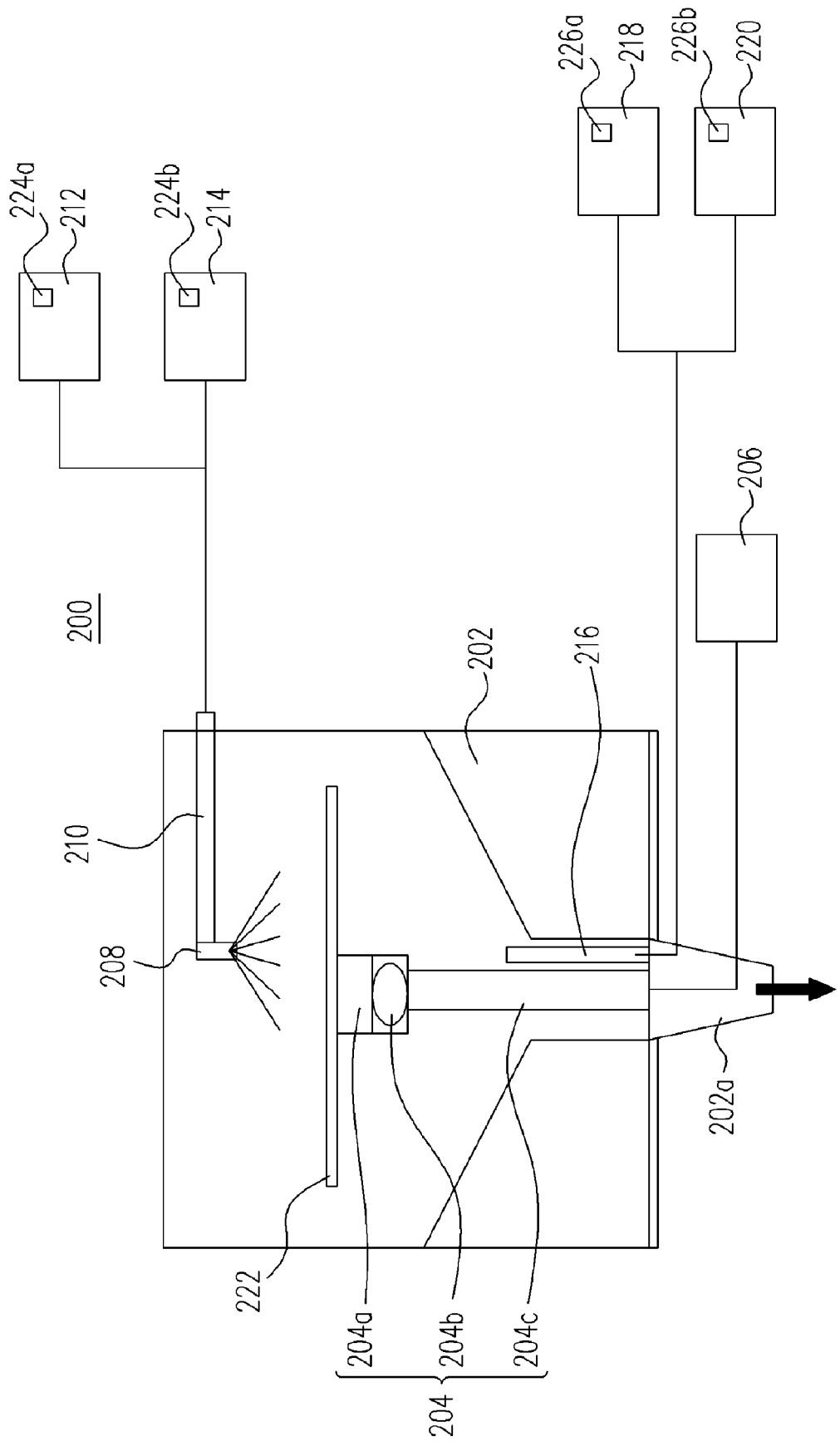
FIG. 2 is a schematic diagram illustrating an ion sampling system for a wafer surface according to a second exemplary embodiment of the present invention.

Second Exemplary Embodiment FIG. 2 is a schematic diagram illustrating an ion sampling system for a wafer surface according to the second exemplary embodiment of the present invention.

Referring to FIG. 2, the ion sampling system 200 for a wafer surface according to the second exemplary embodiment of the present invention includes at least a sampling chamber 202, a wafer carrier apparatus 204, a wafer carrier machine driving system 206, an extraction liquid spraying apparatus 208, an extraction liquid spraying apparatus moving device 210, an extraction liquid supply apparatus 212, a fluid supply apparatus 214, a cleaning/drying spray nozzle 216, a cleaning solution supply apparatus 218, a fluid supply apparatus 220. Further, the cleaning/drying spray nozzle 216, the cleaning solution supply apparatus 218 and the fluid supply apparatus 220 together constitute the cleaning/drying apparatus.

The sampling chamber 202, for example, can be divided into an upper part and a lower part. The upper part of the sampling chamber 202, for example, is designed to accommodate a semiconductor wafer 222 (which includes an 8-inch wafer and a 12-inch wafer). The lower part of the sampling chamber 202, for example, is designed to have a funnel shape. The lower part of the sampling chamber 202 further includes an extract solution collection opening 202a.

The wafer carrier apparatus 204, for example, is configured inside the sampling chamber 202. The wafer carrier apparatus 204 is included with, for example, a carrier platform 204a, a carrier platform adjustment unit 204b and a rotating shaft 204c. The carrier platform 204a and the rotating shaft 204c, for example, are coaxially connected together. Further the dimension of the carrier platform 204a is smaller than the size of a wafer. The carrier platform adjustment unit 204b is disposed between the carrier platform 204a and the rotating shaft 204c for adjusting the carrier platform 204a to tilt at an angle.

The wafer carrier apparatus driving system 206 is connected to the wafer carrier apparatus 204 for rotating the wafer carrier apparatus.

The extraction liquid spraying apparatus 208, for example, is disposed at the top part of the sampling chamber 202. The extraction liquid spraying apparatus 208 is, for example, a spray nozzle (or a nebulizer).

A moving device 210, for example, holds and moves the extraction liquid spraying apparatus 208. Since the moving device 210 moves the extraction liquid spraying apparatus 208, the extraction liquid can cover the wafer entirely. The extraction liquid supply apparatus 212, for example, is connected to the extraction liquid spraying apparatus 208 to supply an extraction liquid to the extraction liquid spraying apparatus 208. The extraction liquid supply apparatus 208 includes a temperature adjustment device 224a to adjust the temperature of the extraction liquid.

The fluid supply apparatus 214, for example, is connected to the extraction liquid spraying apparatus 208 to supply a fluid (which includes nitrogen gas/helium gas/argon gas/pressurized dry air, etc.) to the extraction liquid spraying apparatus 208. The liquid supply device 214 includes a temperature adjustment device 224b for adjusting the fluid temperature.

The cleaning/drying spray nozzle 216, for example, is disposed in the sampling chamber 202 for spraying a cleaning solution (or nitrogen gas/helium gas/argon gas/pressurized dry air, etc.) into the sampling chamber 202 to clean the sampling chamber 202.

The cleaning solution supply apparatus 218, for example, is connected to the cleaning/drying spray nozzle 216 to provide a cleaning solution to the cleaning/drying spray nozzle 216. The cleaning solution supply apparatus 218 further includes a temperature adjustment device 226a to adjust the temperature of the cleaning solution.

The fluid supply apparatus 220, for example, is connected to the cleaning/drying nozzle 216 to supply a fluid (which includes nitrogen gas/helium gas/argon gas/pressurized dry air, etc.) to the cleaning/drying spray nozzle 216 to perform the drying of the sampling chamber 202. The fluid supply apparatus 220 includes a temperature adjustment device 226b for adjusting the temperature of the fluid.

In the second exemplary embodiment, an extraction liquid spraying apparatus 208 that includes a moving device 210 for holding and moving the extraction liquid spraying apparatus 208 is used to illustrate the sampling method of the present invention. Similar to the first exemplary embodiment, the top part of the sampling chamber 202 can be installed with a plurality of extraction liquid spraying apparatus 208, and the moving device 210 becomes optional.

The ion sampling method using the wafer sampling system of the second exemplary embodiment of the present invention is disclosed as follow. This wafer surface ion sampling method is a dynamic-rotational sampling method.

Referring to FIG. 2, a wafer 222 is provided. This wafer 222 is, for example, a 12-inch wafer. Thereafter, the wafer 222 is placed on the carrier platform 204a, wherein fixing the wafer 222 on the carrier platform 204a surface includes adsorption of the wafer 222 on the carrier platform 204a surface. For example, the carrier platform 204a includes a plurality of holes, wherein these holes are connected to a suction device. By using the suction device, the wafer is adsorbed on the carrier platform 204a surface. The surface of the wafer to be sampled faces upward. Further using the wafer carrier apparatus driving system 206, the wafer carrier apparatus 204 is driven to rotate.

Since the wafer is held firmly on the carrier platform 204a by means of adsorption, wafers of various sizes can use this system without the assembling and disassembling of the wafer from the carrier platform 204a.

Further, the extraction liquid supply apparatus 212 provides the extraction liquid (for example, deionized water) to the extraction liquid spraying apparatus 208, which is used to spray extraction liquid to the surface of the wafer 222. By using the moving device 210, the moving direction of the extraction liquid spraying apparatus 208 can be controlled to evenly spray the extraction liquid on the wafer 222 surface. When the extraction liquid is sprayed on the wafer 222 surface, the extraction liquid forms a liquid film on the wafer 222 surface to completely cover the wafer 222 surface. The ions on the wafer 222 surface are then dissolved in the extraction liquid. By controlling the rotating speed of the wafer carrier machine 204, the thickness of the liquid film on the wafer 222 surface is controlled. When the extraction liquid on the wafer 222 surface accumulates to a certain level, a portion of the extract solution is dislodged form the wafer 222 surface to the lower part of the sampling chamber 202. The dislodged extract solution then flows along the tilted surface of the sampling chamber 202 to the extract solution collection opening 202a into a collection bottle (not shown). By continuously spraying the extraction liquid to the wafer surface, and controlling the spraying speed of the extraction liquid and the rotating speed of the wafer, the liquid film on the wafer 222 surface is maintained at a certain thickness. The removal rate of the ion contaminants from the wafer 222 surface is thereby effectively improved. A few minutes after the aforementioned process steps, the ion contaminants on the wafer surface are completely dissolved in the extraction liquid. The supply of the extraction liquid can be immediately discontinued. Further, the high speed rotation of the wafer and the supply of fluid (e.g. nitrogen gas/helium gas/argon gas) from the fluid supplying apparatus 214 are used to blow dry the extraction liquid residual on the wafer 222 surface. The supply of fluid and the rotation of the wafer carrier machine can be terminated.

The extract solution that is collected at the extract solution collection opening 202a is analyzed to determine the amount ions using ion chromatograph. The extraction liquid can also be concentrated using ion chromatograph before analyzing for the amount of ions.

Thereafter, the wafer 222 is removed from the wafer carrier machine 204. Cleaning solution is provided to the cleaning/drying spray nozzle 216 by the cleaning solution supply apparatus 218 to clean the sampling chamber 202. After thoroughly cleaning the sampling chamber 202, the supply of the cleaning solution is terminated. A fluid (nitrogen gas/helium gas/argon gas/pressurized dry air, etc.) is supplied from the fluid supply apparatus 220 to blow dry the sampling chamber 202. The provision of fluid is discontinued after the sampling chamber 202 is dried. The cleaning of the sampling chamber 202 can also be conducted using the extraction liquid spraying apparatus 208.

In accordance to the present invention, during the sampling of the ion contaminants, the extraction liquid is sprayed on the wafer surface where ion contaminants are going to be removed. Further, by rotating the wafer, the surface where ion contaminants are going to be removed is completely covered by the extraction liquid. Since the ion contaminants on the surface of the wafer are dissolved by the extraction liquid, the amount of the ion contaminants on the wafer surface is accurately detected. Further, by controlling the rotating speed of the wafer carrier machine 204, the liquid film on the wafer 222 surface is maintained at a certain thickness to effectively dissolve the ion contaminants on the wafer surface. Moreover, the amount of extraction liquid used in the ion sampling system for a wafer surface and the sampling method of the present invention is less than that used in a conventional system and method. The amount of extraction liquid used and the time required for concentrating the extract solution are reduced to further scale down the manufacturing cost.

Further, the sampling system for wafer according to the second exemplary embodiment of the present invention includes a cleaning apparatus. The sampling system comprising the cleaning apparatus can be programmed to clean the sampling chamber to maintain a clean ambient in the sampling chamber. In addition, after the cleaning and the drying of the sampling chamber, another cleaning process can be conducted in which the cleaning solution is collected and tested to determine whether the cleaning of the sampling chamber is satisfactory.

Further, the ion contaminant sampling system for a wafer surface of the present invention can be installed in a clean mini environment, for example, inside a hood that is installed with a fan, a chemical filtering device and an ultra low penetration air filter (ULPA). Since the ultra-micro particles can be filtered by the ULPA filter inside the hood, while the chemical filtering device provides the function of removing acid or basic compounds, the hood can maintain clean.

The sampling system for wafer according to the second exemplary embodiment of the present invention is applicable for the stationary-tilt sampling method or the dynamic-rotational sampling method. Further, by combining the two methods, ions are more effectively dissolved in the extraction liquid.

Referring to FIG. 2, the stationary-tilt sampling method is first conducted. After fixing the wafer 222 on the carrier platform 204a, the carrier platform adjustment device 204a is used to tilt the carrier platform 204a at an angle. Thereafter, the extraction liquid spraying apparatus 208 is used to spray the extraction liquid evenly on the wafer 222 surface to form a liquid film on the wafer 222 surface. The ions on the wafer 222 surface are dissolved in the extraction liquid. A portion of the extract solution flows along the tilted surface of the sampling chamber, and is discharged from the extract solution collection opening 202a into a collection bottle (not shown).

Thereafter, the dynamic-rotational sampling method is performed. The wafer carrier machine 204 is set to rotate, wherein the extraction liquid is continuously sprayed on the wafer 222 surface to form the liquid film. By controlling the rotating speed of the wafer carrier machine 204, the thickness of the liquid film is controlled. Further, a portion of the extract solution is dislodged from the wafer 222 surface. The dislodged extract solution then flows along the tilted surface of the sampling chamber, and is discharged from the extract solution collection opening 202a to a collection bottle (not shown). After the sampling process is conducted for a certain time interval, the wafer carrier machine 204 is stopped from rotating.

The stationary-tilt sampling method and the dynamic-rotational sampling method are repeated for several times to completely dissolve the ion contaminants on the wafer surface in the extraction liquid. The provision of the extraction liquid is then discontinued and a fluid (nitrogen gas/helium gas/argon gas/pressurized dry air) is supplied by the fluid supply apparatus 214 for blow drying the extraction liquid residual on the wafer 222 surface. Thereafter, the supply of the fluid (nitrogen gas/helium gas/argon gas/pressurized dry air) is terminated, and the wafer carrier machine is stopped from rotating.

In addition, the extract solution collected from the extract solution collection opening 202a is ready to be analyzed for the amount of ions using ion chromatography. The extract solution collected from the extract solution collection opening 202a is concentrated first using an ion chromatography analyzer before analyzing for the amount of ions.

The sampling of ion contaminants in accordance to the present invention applies both the stationary-tilt sampling method and the dynamic-rotational sampling method. The liquid film on the wafer surface is being rotated or moved constantly. The transfer of ions from the wafer surface to the extraction liquid is thereby enhanced.

Besides for detecting ion contaminants on a wafer surface, the ion sampling system of a wafer surface and the sampling method can also be applied to monitor the environmental contamination or the wafer environment (for example, the wafer carrier, and the peripheral environment). As an example, subsequent to the cleaning, the wafer remains on the wafer carrier for a period of time. Using the sampling system and sampling method of the present invention, the extent of ion contamination on a wafer surface can be detected to determine whether the interior of the wafer carrier is being contaminated.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

The invention claimed is:

1. A wafer surface ion sampling system, comprising:
   a sampling chamber, comprised an upper part and a lower part, wherein the upper part accommodates a wafer, and the lower part has a funnel shape and comprises an extract solution collection opening;
   a plurality of wafer carrier beams for holding the wafer, arranged around an upper part of a sidewall of the sampling chamber dispersedly, wherein each wafer carrier beam comprises a first wafer anchoring pin disposed on a peripheral surface of the wafer carrier beam, wherein the wafer anchoring pin extends in a first direction different from the direction which the wafer carrier beam extends, and each of the wafer carrier beams extends from the upper sidewall to the inside of the sampling chamber and passes the upper sidewall of the sampling chamber to the outside of the sampling chamber;
   an extraction liquid spraying apparatus, disposed at a top part of the sampling chamber to spray an extraction liquid on a surface of the wafer; and
   an extraction liquid supply apparatus, connected to the extraction liquid spraying apparatus to provide the extraction liquid to the extraction liquid spraying apparatus.

2. The system of claim 1, wherein each of the wafer carrier beams further comprises a rotating handle disposed on the one end of the wafer carrier beam at the outside of the sampling chamber.

3. The system of claim 1, wherein the peripheral surface of the wafer carrier beam further comprises a second wafer anchoring pin that extends in a second direction, wherein the second direction is different from the first direction.

4. The system of claim 1, wherein there are at least three wafer carrier beams.

5. The system of claim 1, wherein at least a height of one of the wafer carrier beams is lower than a height of the other wafer carrier beams.

6. The system of claim 1, wherein the extraction liquid spraying apparatus comprises a plurality of spray nozzles or nebulizers, evenly disposed at the top part of the sampling chamber.

7. The system of claim 1, wherein the extraction liquid supply apparatus further comprises a temperature adjustment device to control a temperature of the extraction liquid.

8. The system of claim 1 further comprising a cleaning/drying apparatus, wherein the cleaning/drying apparatus comprises:
   a cleaning/drying spray nozzle, disposed in the sampling chamber to spray a cleaning solution or a fluid into the sampling chamber;
   a cleaning solution supply apparatus, connected to the cleaning/spray nozzle to supply the cleaning solution to the cleaning/drying spray nozzle; and
   a fluid supply apparatus, connected to the cleaning/drying spray nozzle to supply the fluid to the cleaning/drying spray nozzle.

9. The system of claim 8, wherein the cleaning solution supply apparatus comprises a temperature adjustment device to control a temperature of the cleaning solution.

10. The system of claim 8, wherein the fluid supply apparatus further comprises a temperature adjustment device to control a temperature of the fluid.

* * * * *